United States Patent
Iyechika et al.

(10) Patent No.: US 6,806,502 B2
(45) Date of Patent: Oct. 19, 2004

(54) 3-5 GROUP COMPOUND SEMICONDUCTOR AND LIGHT EMITTING DEVICE

(75) Inventors: Yasushi Iyechika, Tsukuba (JP); Yoshihiko Tsuchida, Tsukuba (JP); Yasuyuki Kurita, Tsukuba (JP)

(73) Assignee: Sumitomo Chemical Company, Limted, Osaka (JP)

( * ) Notice: Subject to any disclaimer, the term of this patent is extended or adjusted under 35 U.S.C. 154(b) by 0 days.

(21) Appl. No.: 09/987,660

(22) Filed: Nov. 15, 2001

(65) Prior Publication Data

US 2002/0105013 A1 Aug. 8, 2002

(30) Foreign Application Priority Data

Nov. 17, 2000 (JP) ......................................... 2000-350776

(51) Int. Cl.[7] ............................................... H01L 31/12
(52) U.S. Cl. ............................. 257/79; 257/86; 257/96; 257/101; 257/103; 257/190; 257/615; 438/22; 438/37; 438/933; 438/936
(58) Field of Search .............................. 257/79, 86, 96, 257/101, 103, 190, 615; 438/22, 37, 933, 936

(56) References Cited

U.S. PATENT DOCUMENTS

| | | | |
|---|---|---|---|
| 5,122,845 A | | 6/1992 | Manabe et al. |
| 5,926,726 A | | 7/1999 | Bour et al. |
| 6,023,077 A | * | 2/2000 | Iyechika et al. ............ 257/103 |
| 6,060,335 A | | 5/2000 | Rennie et al. |
| 6,067,309 A | * | 5/2000 | Onomura et al. ............ 372/45 |
| 6,204,084 B1 | * | 3/2001 | Sugiura et al. ............. 257/103 |

FOREIGN PATENT DOCUMENTS

| | | |
|---|---|---|
| JP | 6-21511 | 1/1994 |
| JP | 8-18159 | 1/1996 |
| JP | 9-36425 | 2/1997 |
| JP | 90 64419 | 3/1997 |
| JP | 9-116130 | 5/1997 |

* cited by examiner

Primary Examiner—David Nelms
Assistant Examiner—Long Tran
(74) Attorney, Agent, or Firm—Birch, Stewart, Kolasch & Birch, LLP

(57) ABSTRACT

Provide is a 3–5 group compound semiconductor having a concentration of a p-type dopant of $1 \times 10^{17}$ cm$^-$ or more and $1 \times 10^{21}$ cm$^{-3}$ or less, which can be laminated to control the carrier concentration of an InGaAlN-type mixed crystal in a low range with high reproducibility. Also provided is a 3–5 group compound semiconductor in which the carrier concentration of an InGaAlN-type mixed crystal is controlled in a low range with high reproducibility, and a light emitting device having high light emitting efficiency.

8 Claims, 1 Drawing Sheet

3-5 GROUP COMPOUND SEMICONDUCTOR AND LIGHT EMITTING DEVICE

BACKGROUND OF THE INVENTION

1. Field of the Invention

The present invention relates to a III–V group compound semiconductor represented by the general formula $In_xGa_yAl_zN$ (x+y+z=1, $0 \leq x \leq 1$, $0 \leq y \leq 1$, $0 \leq z \leq 1$) and a light emitting device obtained by using the same.

2. Description of the Related Art

As materials of light emitting devices such as ultraviolet, blue or green light emitting diodes, ultraviolet, blue or green laser diodes and the like, III–V group compound semiconductors represented by the general formula $In_xGa_yAl_zN$ (wherein, x+y+z=1, $0 \leq x \leq 1$, $0 \leq y \leq 1$, $0 \leq z \leq 1$) are known. Hereinafter, x, y and z in this general formula are described as InN crystal mixing ratio, GaN crystal mixing ratio and AlN crystal mixing ratio, in some cases. Of the III–V group compound semiconductors, those containing InN in a crystal mixing ratio of 10% or more are particularly important for display uses since it is possible to control a light emitting wavelength in the visible region, depending on InN crystal mixing ratio.

It is known, incidentally, that this compound semiconductor manifests physical properties varying significantly depending on crystal mixing ratio. For example, GaAlN-type mixed crystals containing no In can be produced under a growth temperature of 1000° C. or more, for obtaining crystal with an excellent thermal stability. On the other hand, InGaAlN-type mixed crystals containing In are generally grown at a temperature of about 800° C. which is relatively lower as such compound semiconductors, since thermal stability is not sufficient depending on InN crystal mixing ratio. Therefore, regarding heterojunction using an InGaAlN-type mixed crystal which is important as a light emitting device in the region of visible light, it is necessary that a layer grown directly after an active layer, what is called a barrier layer, is grown at the same level of low growth-temperature as that of the active layer. On the other hand, since a barrier layer regulates current injection into an active layer, the carrier concentration should be controlled strictly. However, it has been difficult to control the concentration of a remaining carrier in a lower range, the concentration being believed to be derived from nitrogen vacancy. Consequently, uniformity and reproducibility of light emitting efficiency were sometimes not sufficient, in the case of a light emitting device.

An object of the present invention is to provide a III–V group compound semiconductor having a concentration of a p-type dopant of $1 \times 10^{17}$ cm$^{-3}$ or more and $1 \times 10^{21}$ cm$^{-3}$ or less, which can be laminated to control the carrier concentration of an InGaAlN-type mixed crystal in a low range with high reproducibility. Another object of the present invention is to provide a III–V group compound semiconductor in which the carrier concentration of an InGaAlN-type mixed crystal is controlled in a low range with high reproducibility, and a light emitting device having high light emitting efficiency obtained by using this III–V group compound semiconductor.

SUMMARY OF THE INVENTION

The present inventors have intensively studied, in view of the above-mentioned problems, and resultantly found that an n-type III–V group compound semiconductor having a small carrier concentration can be produced with high reproducibility when a p-type dopant is doped at a specific concentration, in growth at low temperatures at which carrier concentration cannot be controlled easily, leading to completion of the invention.

Namely, the present invention relates to III–V group compound semiconductor represented by the general formula $In_xGa_yAl_zN$ (x+y+z=1, $0 \leq x \leq 1$, $0y \leq 1$, $0 \leq z \leq 1$) in which the concentration of an n-type carrier is $1 \times 10^{19}$ cm$^{-3}$ or less, wherein the concentration of a p-type dopant is $1 \times 10^{17}$ cm$^{-3}$ or more and $1 \times 10^{21}$ cm$^{-3}$ or less.

Further, the present invention relates to [2] III–V group compound semiconductor having a structure in which a second layer composed of a III–V group compound semiconductor represented by the general formula $In_uGa_vAl_wN$ (u+v+w=1, $0 < u \leq 1$, $0 \leq v \leq 1$, $0 \leq w < 1$) is adjacent to a first layer composed of a III–V group compound semiconductor represented by the general formula $In_xGa_yAl_zN$ (x+y+z=1, $0 \leq x \leq =1$, $0 \leq y \leq 1$, $0 \leq z \leq 1$) in which the concentration of an n-type carrier is $1 \times 10^{19}$ cm$^{-3}$ or less, wherein the concentration of a p-type dopant is $1 \times 10^{17}$ cm$^{-3}$ or more and $1 \times 10^{21}$ cm$^{-3}$ or less, and the band gap is larger than that of the above-mentioned second layer.

Further, the present invention relates to [3] a III–V group compound semiconductor having a structure in which a layer composed of a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ cm$^{-3}$ or less, wherein the concentration of a p-type dopant is $1 \times 10^{17}$ cm$^{-3}$ or more and $1 \times 10^{21}$ cm$^{-3}$ or less is adjacent to a layer composed of a p-type III–V group compound semiconductor represented by the general formula $In_aGa_bAl_cN$ (a+b+c=1, $0 \leq a \leq 1$, $0 \leq b \leq 1$, $0 \leq c \leq 1$).

Further, the present invention relates to [4] a III–V group compound semiconductor having a structure comprising at least one layer composed of a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ cm$^{-3}$ or less, wherein the concentration of a p-type dopant is $1 \times 10^{17}$ cm$^{-3}$ or more and $1 \times 10^{21}$ cm$^{-3}$ or less, between a layer composed of a III–V group compound semiconductor represented by the general formula $In_uGa_vAl_wN$ (u+v+w=1, $0 < u \leq 1$, $0 \leq v < 1$, $0 \leq w < 1$) and a layer composed of a p-type III–V group compound semiconductor represented by the general formula $In_aGa_bAl_cN$ (a+b+c=1, $0 \leq a \leq 1$, $0 \leq b \leq 1$, $0 \leq c \leq 1$).

Further, the present invention relates to [5] a III–V group compound semiconductor having a structure comprising a second layer composed of a III–V group compound semiconductor represented by the general formula $In_uGa_vAl_wN$ (u+v+w=1, $0 < u \leq 1$, $0 \leq v < 1$, $0 \leq w < 1$) carrying thereon a laminated layer composed of an n-type III–V group compound semiconductor represented by the general formula $In_pGa_qAl_rN$ (p+q+r=1, $0 \leq p \leq 1$, $0 \leq q \leq 1$, $0 \leq r \leq 1$) having larger band gap than that of the above-mentioned second layer, and at least one layer composed of a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ cm$^{-3}$ or less, wherein the concentration of a p-type dopant is $1 \times 10^{17}$ cm$^{-3}$ or more and $1 \times 10^{21}$ cm$^{-3}$ or less, between the above-mentioned layer composed of the n-type III–V group compound semiconductor and a third layer composed of a p-type III–V group compound semiconductor represented by the general formula $In_aGa_bAl_cN$ (a+b+c=1, $0 \leq a \leq 1$, $0 \leq b \leq 1$, $0 \leq c \leq 1$), on the opposite side to the above-mentioned second layer.

Further, the present invention relates to [6] a method of producing a III–V group compound semiconductor according to any of [1] to [5], comprising growing a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ cm$^{-3}$ or less, wherein the concentration of a p-type dopant is $1 \times 10^{17}$ cm$^{-3}$ or more and $1 \times 10^{21}$ cm$^{-3}$ or less, at temperatures of 600° C. or more and 950° C. or less according to a metal organic vapor phase growth method.

Further, the present invention relates to [7] a light emitting device obtained by using a III–V group compound semiconductor according to any of [1] to [5].

DETAILED DESCRIPTION OF THE INVENTION

Figure 1:
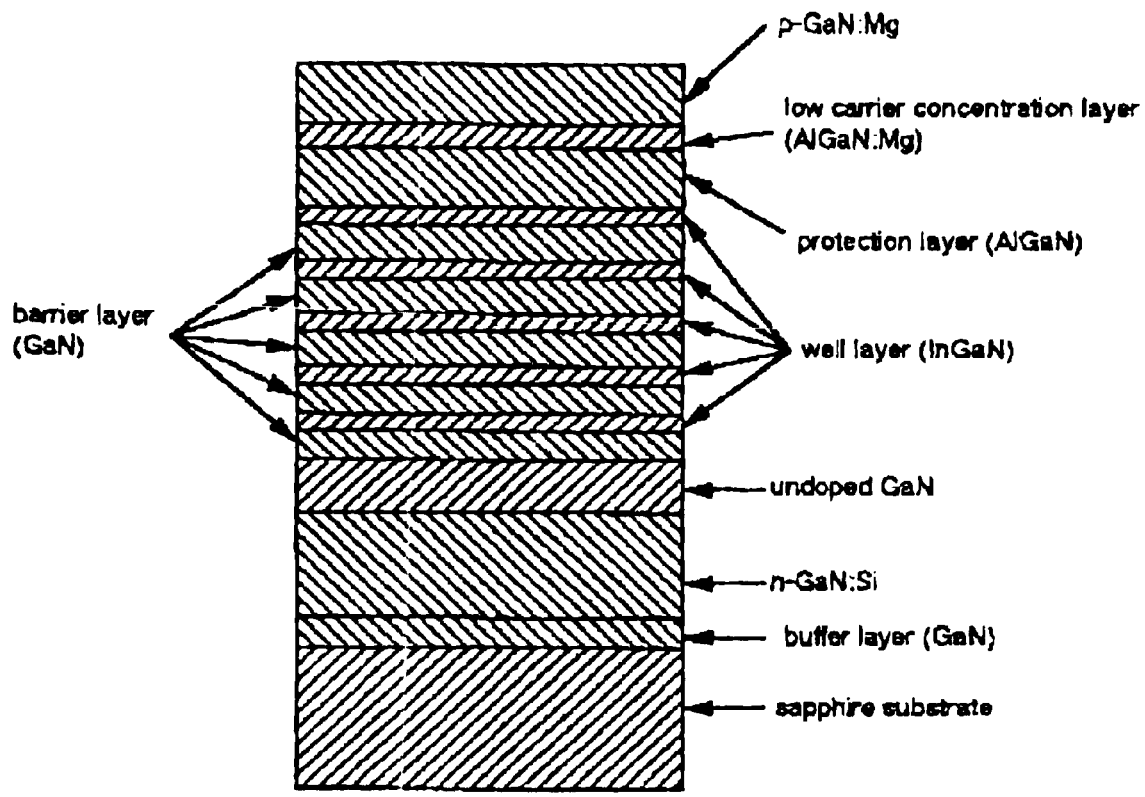
FIG. 1 is illustrative of the structure of the semiconductor produced in Example 5, infra.

As the method of producing a III–V group compound semiconductor in the present invention, there are listed a molecular beam epitaxy (hereinafter, abbreviated as MBE in some cases) method, a metal organic vapor phase epitaxy (hereinafter, abbreviated as MOVPE in some cases) method, a hydride vapor phase epitaxy (hereinafter, abbreviated as HVPE in some cases) method, and the like. Of them, an MOVPE method is particularly important since a crystal can be grown uniformly over a large area.

In production of a III–V group compound semiconductor according to an MOVPE method, the following raw materials can be used.

As the Group III raw material, trialkylgallium of the general formula $R_1R_2R_3Ga$ (wherein, $R_1$, $R_2$ and $R_3$ represent a lower alkyl group) such as trimethylgallium [$(CH_3)_3$Ga, hereinafter, abbreviated as TMG in some cases], triethylgallium [$(C_2H_5)_3$Ga, hereinafter, abbreviated as TEG in some cases] and the like; trialkylaluminum of the general formula $R_1R_2R_3Al$ (wherein, $R_1$, $R_2$ and $R_3$ represent a lower alkyl group) such as trimethylaluminum [$(CH_3)_3Al$], triethylaluminum [$(C_2H_5)_3Al$, hereinafter, abbreviated as TEA in some cases], triisobutylaluminum [$(i-C_4H_9)_3Al$ and the like; trimethylaminealane [$(CH_3)_3N$:$AlH_3$); trialkylindium of the general formula $R_1R_2R_3In$ (wherein, $R_1$, $R_2$ and $R_3$ represent a lower alkyl group) such as trimethylindium [$(CH_3)3In$, hereinafter, abbreviated as "TMI" in some cases], triethylindium [$(C_2H_5)_3In$] and the like; and other materials, are listed. These are used alone or in admixture.

As the Group V raw material, ammonia, hydrazine, methylhydrazine, 1,1-dimethylhydrazine, 1,2-dimethylhydrazine, t-butylamine, ethylenediamine and the like are listed. These are used alone or in admixture. Of these raw materials, ammonia and hydrazine are suitable since they contain no carbon atom in the molecule and consequently cause small contamination of carbon into a semiconductor.

As the p-type dopant which can be used in the present invention, Group II metals are listed. Specifically, Be, Mg, Ca, Zn, Cd and Hg are listed. Among them, Be, Mg, Ca, Zn and Cd are useful since they can be used simply. The dopant can be used alone or in combination of two or more.

Particularly, Mg and Zn can be suitably used since some materials containing Mg and Zn are known to be suitable for an MOVPE method. Specific examples of the Mg raw material which can be used for an MOVPE method include $(C_5H_5)_2Mg$ (biscyclopentadienylmagnesium), $(C_5H_4CH_3)_2Mg$ (bismethylcyclopentadienylmagnesium), $(C_5H_4C_2H_5)_2Mg$ (bisethylcyclopentadienylmagnesium, hereinafter, abbreviated as ECp2Mg in some cases) and the like. Specific examples of the Zn raw material which can be used for an MOVPE method include $(C_2H_5)Zn$ (diethylzinc), $(CH_3)_2Zn$ (dimethylzinc) and the like.

When the above-mentioned compound semiconductor is grown by an MOVPE method, the growth temperature is 600° C. or more and 1000° C. or less.

The III–V group compound semiconductor [1] of the present invention is a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ cm$^{-3}$ or less, wherein the concentration of a p-type dopant is $1 \times 10^{17}$ cm$^{-3}$ or more and $1 \times 10^{21}$ cm$^{-3}$ or less.

Further, III–V group compound semiconductor [2] of the present invention has a structure in which a second layer composed of a III–V group compound semiconductor represented by the general formula $In_uGa_vAl_wN$ (u+v+w=1, $0<u \leq 1$, $0 \leq v<1$, $0 \leq w \leq 1$) is adjacent to a first layer composed of a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ cm$^{-3}$ or less, wherein the concentration of a p-type dopant is $1 \times 10^{17}$ cm$^{-3}$ or more and $1 \times 10^{21}$ cm$^{-3}$ or less, and the band gap is larger than that of the above-mentioned second layer (hereinafter, the first layer is referred to as low carrier concentration layer, in some cases).

When used as a light emitting device, the second layer has a function as a light emitting layer. For efficient recombination and light emission of injected charges, it is preferable that a low carrier concentration layer has larger band gap than that of a light emitting layer. The band gap of a low carrier concentration layer is larger than that of a light emitting layer by preferably 0.1 eV or more, further preferably 0.3 eV or more.

Further, the preferable film thickness of a low carrier concentration layer is 10 Å or more and 1 μm or less. The light emitting efficiency of a light emitting device may decrease both when the film thickness of a low carrier concentration layer is lower than 10 Å and when larger than 1 μm.

When the p-type dopant concentration is smaller than $1 \times 10^{17}$ cm$^{-3}$, it is difficult to control the n-type carrier concentration of a compound semiconductor doped with a p-type impurity, to the intended small value, with high reproducibility. When the p-type dopant concentration is larger than $10^{21}$ cm$^{-3}$, the compound semiconductor doped with a p-type impurity manifests reduction in crystallinity, and when it is laminated with a layer (light emitting layer) composed of a III–V group compound semiconductor represented by the general formula $In_uGa_vAl_wN$ (u+v+w=1, $0<u \leq 1$, $0 \leq v<1$, $0 \leq w<1$), the properties of the light emitting layer may decrease in some cases. The more preferable concentration of a p-type impurity is $1 \times 10^{18}$ cm$^{-3}$ or more and $1 \times 10^{20}$ cm$^{-3}$ or less.

Further, the III–V group compound semiconductor [3] of the present invention has a structure in which a layer composed of a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1\times10^{19}$ cm$^{-3}$ or less, wherein the concentration of a p-type dopant is $1\times10^{17}$ cm$^{-3}$ or more and $1\times10^{21}$ cm$^{-3}$ or less is adjacent to a layer composed of a p-type III–V group compound semiconductor represented by the general formula $In_aGa_bAl_cN$ (a+b+c=1, $0\leq a\leq1$, $0\leq b\leq1$, $0\leq c\leq1$).

The III–V group compound semiconductor in which a layer having a function as a barrier layer in which the p-type dopant concentration is in a specific range is adjacent with a p-type layer can be combined with a layer composed of a III–V group compound semiconductor represented by the general formula $In_uGa_vAl_wN$ (u+v+w=1, $0<u\leq1$, $0\leq v<1$, $0\leq w<1$) having a function as a light emitting layer, to give a light emitting device excellent in light emitting efficiency.

Further, the III–V group compound semiconductor [4] of the present invention has a structure comprising at least one layer (low carrier concentration layer) composed of a III–V group compound semiconductor represented by the general formula $In_xGa_yAl_zN$ (x+y+z=1, $0\leq x\leq1$, $0\leq y\leq1$, $0\leq z\leq1$) in which the concentration of an n-type carrier is $1\times10^{19}$ cm$^{-3}$ or less, wherein the concentration of a p-type dopant is $1\times10^{17}$ cm$^{-3}$ or more and $1\times10^{21}$ cm$^{-3}$ or less, between a layer (light emitting layer) composed of a III–V group compound semiconductor represented by the general formula $In_uGa_vAl_wN$ (u+v+w=1, $0<u\leq1$, $0\leq v<1$, $0\leq w<1$) and a layer composed of a p-type III–V group compound semiconductor represented by the general formula $In_aGa_bAl_cN$ (a+b+c=1, $0\leq a\leq1$, $0\leq b\leq1$, $0\leq c\leq1$).

By providing at least one low carrier concentration layer as layers between a light emitting layer and a p-type layer, a light emitting device having high light emitting efficiency can be produced with high reproducibility. Particularly, when a low carrier concentration layer is adjacent to a light emitting layer, it is preferable that the low carrier concentration layer has a larger band gap than that of the light emitting layer, for efficient recombination of electric charges in the light emitting layer. The band gap of a low carrier concentration layer is larger than that of a light emitting layer by preferably 0.1 eV or more, further preferably 0.3 eV or more.

Further, when used in a light emitting device, the III–V group compound semiconductor [5] has a structure comprising a second layer composed of a III–V group compound semiconductor represented by the general formula $In_uGa_vAl_wN$ (u+v+w=1, $0<u\leq1$, $0\leq v<1$, $0\leq w<1$) carrying thereon a laminated layer composed of an n-type III–V group compound semiconductor represented by the general formula $In_pGa_qAl_rN$ (p+q+r=1, $0\leq p\leq1$, $0\leq q\leq1$, $0\leq r\leq1$) having larger band gap than that of the above-mentioned second layer, and at least one layer composed of a III–V group compound semiconductor represented by the general formula $In_xGa_yAl_zN$ (x+y+z=1, $0\leq x\leq1$, $0\leq y\leq1$, $0\leq z\leq1$) in which the concentration of an n-type carrier is or $1\times10^{19}$ cm$^{-3}$ or less, wherein the concentration of a p-type dopant is $1\times10^{17}$ cm$^{-3}$ or more and $1\times10^{21}$ cm$^{-3}$ or less, between the above-mentioned layer composed of the n-type III–V group compound semiconductor and a third layer composed of a p-type III–V group compound semiconductor represented by the general formula $In_aGa_bAl_cN$ (a+b+c=1, $0\leq a\leq1$, $0\leq b\leq1$, $0\leq c\leq1$), on the opposite side to the above-mentioned second layer.

For example, in this III–V group compound semiconductor, a light emitting layer, n-type layer, low carrier concentration layer and p-type layer are adjacent in this order. For efficient recombination and light emission of injected charges, it is preferable that the bang gap of an n-type layer is larger than that of a light emitting layer. The band gap between an n-type layer and a light emitting layer is preferably 0.1 eV or more, more preferably 0.3 eV or more. The preferable film thickness of an n-type layer is 10 Å or more and 1 μm or less. The light emitting efficiency of a light emitting device may decrease both when the film thickness of a low carrier concentration layer is lower than 10 Å and when larger than 1 μm. Further, the preferable film thickness of a low carrier concentration layer is 10 Å or more and 1 μm or less. The light emitting efficiency of a light emitting device may decrease both when the film thickness of a low carrier concentration layer is lower than 10 Å and when larger than 1 μm.

In the III–V group compound semiconductor of the present invention, when the crystal mixing ratio of InN of a light emitting layer is high, thermal stability is not sufficient, and deterioration may occur in crystal growth or semiconductor process. For the purpose of preventing such deterioration, a layer having low crystal mixing ratio of InN can be laminated on a light emitting layer, to impart a function as a protective layer to this layer. The low carrier concentration layer of the present invention has a function as a protective layer. For giving sufficient protective function to the protective layer, it is preferable that the protective layer as an InN crystal mixing ratio of 10% or less and an AlN crystal mixing ratio of 5% or more, and it is more preferable that the protective layer as an InN crystal mixing ratio of 5% or less and an AlN crystal mixing ratio of 10% or more.

Since a light emitting layer generally has no excellent thermal stability, it is not preferable to grow, at higher temperature, a low carrier concentration layer grown after a light emitting layer. When a low carrier concentration layer is grown by an MOVPE method, the growth temperature of a low carrier concentration layer is preferably 950° C. or lower, further preferably 900° C. or lower, particularly preferably 850° C. or lower, for suppressing deterioration of a light emitting layer. When a low carrier concentration layer is grown by an MOVPE method, the growth temperature is preferably 600° C. or higher, further preferably 650° C. or higher, particularly preferably 700° C. or higher, for obtaining excellent crystallinity.

As described above, the light emitting device of the present invention is obtained by using a III–V group compound semiconductor according to any of the above-mentioned [1] to [5].

EXAMPLES

The following examples and comparative examples will illustrate the present invention in detail below, but do not limit the scope of the present invention.

Examples 1 to 4, Comparative Example 1

First, a 4 μm thick GaN was grown at 1060° C. without impurity-doping on a low temperature grown buffer layer on sapphire. On this GaN layer, an AlGaN layer was grown with feeding a Mg material (Examples 1 to 4, and Comparative Example 1). In growth of AlGaN, ammonia, triethylgallium ($(C_2H_5)_3Ga$, hereinafter, abbreviated as TEG in some cases), trimethylaluminum ($(CH_3)_3Al$, hereinafter, abbreviated as TMA in some cases), and ECp2Mg were used, as raw materials. The carrier gas was nitrogen, and the growth temperature was 785° C. The AlN crystal mixing ratio measured by X-ray diffraction was 12 to 16%.

After growth, these samples were taken out from a reaction furnace, and annealed under nitrogen flow of 1 atm in another annealing furnace at 800° C. for 20 minutes. After annealing, the samples were subjected to photoelectromotive force measurement and capacity-voltage (C-V) method, to confirm that all of them were of n-type, and carrier concentrations thereof were measured. The resulted carrier concentrations are shown in Table 1.

Mg was analyzed on these samples, by a secondary ion mass spectrometry (SIMS) method. The resulted Mg concentrations are shown in Table 1.

Table 1 teaches that when the Mg doping amount is as low as $1\times10^{16}$ cm$^{-3}$, the concentration of an n-type carrier is $1.1\times10^{19}$ cm$^{-3}$, while if Mg is doped at a concentration of $4\times10^{19}$ cm$^{-3}$ or more so as to keep the p-type dopant concentration in the range from $1\times10^{17}$ cm$^{-3}$ to $1\times10^{21}$ cm$^{-3}$, the carrier concentration can be controlled to $5\times10^{18}$ cm$^{-3}$ or less.

TABLE 1

|  | Mg concentration (cm$^{-3}$) | Carrier concentration (cm$^{-3}$) |
| --- | --- | --- |
| Comparative example 1 | $1.1 \times 10^{16}$ | $1.1 \times 10^{19}$ |
| Example 1 | $4.0 \times 10^{19}$ | $\leq 5 \times 10^{18}$ |
| Example 2 | $9.4 \times 10^{19}$ | $1 \times 10^{17}$ |
| Example 3 | $1.6 \times 10^{20}$ | $2 \times 10^{16}$ |
| Example 4 | $4.4 \times 10^{20}$ | $4 \times 10^{16}$ |

Example 5

GaN was grown as a low temperature buffer layer on sapphire, and an n-type GaN layer doped with Si was grown thereon, further, a undoped GaN layer was grown using hydrogen as a carrier gas at 1060° C. Ammonia, trimethylgallium ((CH$_3$)$_3$Ga, hereinafter, abbreviated as TMG in some cases), and silane were used as raw materials.

Further, five pairs of 15 nm GaN and 2.5 nm InGaN were laminated at 730° C. using nitrogen as a carrier gas to give a multiple quantum well structure, and AlGaN was laminated to give a protective layer of 25 nm under the conditions in Comparative Example 1, then, the laminate was cooled, taken out once from the reaction furnace, and optical properties were evaluated.

This sample was returned into the reaction furnace again, and annealed under an atmosphere of nitrogen/ammonia at 1000° C. for 1 minute, then, cooled to 765° C., and a low carrier concentration layer of 25 nm was laminated under the conditions in Example 2. Ammonia, TEG, TMA and ECp2Mg were used as raw materials. Then, a GaN layer of 200 nm doped with Mg was laminated at 1060° C. using hydrogen as a carrier gas. After growth, annealing was conducted under the same conditions as in Example 1, then, a light emitting device was produced by an ordinary method, and the light emitting properties thereof were measured to know that the light emitting wavelength was 430 nm and the output powder was 700 UW in driving at 20 mA.

In this example, the sample was taken out once from the reaction furnace, then, returned into the reaction furnace again, and a low carrier concentration layer and a p layer were grown. Alternatively, a continuous growth mode may be adopted without taking the sample from the reaction furnace.

Comparative Example 2

A light emitting device was produced in the same manner as in Example 5 except that a protective layer of 50 nm was grown and a low carrier concentration layer was not grown, and the properties of the device were evaluated. The light emitting wavelength was 430 nm and the output powder was 460 $\mu$W in driving at 20 mA.

A light emitting device having high output powder can be produced in the same manner as in Example 5 except that a low carrier concentration layer of 50 nm was directly grown without laminating a protective layer and without taking out a sample from a reaction furnace.

Examples 7, 8 and 9

An n-type GaN layer, non-doped GaN layer and multiple quantum well structure were laminated on a sapphire substrate in the same manner as in Example 5, then, AlGaN of 6.5 nm was further grown as a protective layer. However, the growth temperature of the multiple quantum well structure was changed to 750° C. Using this sample, LEDs were produced as in Example 5 except that the production conditions for a low carrier concentration layer were changed as shown below. Namely, in one example, the Mg doping amount was the same as in Example 5 and the thickness of a low carrier concentration layer was changed to 31 nm (Example 7), in one example, the Mg doping amount was the same as in Example 5 and the thickness of a low carrier concentration layer was changed to 43.5 nm (Example 8), and in one example, the Mg doping amount was 2-fold than in Example 5 and the thickness of a low carrier concentration layer was changed to 43.5 nm (Example 9). Further, as a comparative example, LED was produced in the same manner as in Example 5 except that the growth temperature of a multiple quantum well structure was 750° C. and a low carrier concentration layer was not doped with Mg (Comparative Example 3). The average light output in plane was 1.3 mW, 1.4 mW and 2.1 mW in Examples 7, 8 and 9, respectively, and 0.95 mW in Comparative Example 3.

In the above-mentioned examples, Mg was used as a p-type dopant, however, Zn can also be used as a p-type dopant to obtain the same results.

The III–V group compound semiconductor of the present invention can be laminated to control the carrier concentration of an InGaAlN mixed crystal in a lower range with high reproducibility since the p-type dopant concentration of the semiconductor is $1\times10^{17}$ cm$^{-3}$ or more and $1\times10^{21}$ cm$^{-3}$ or less. Further, in the III–V group compound semiconductor of the present invention, the carrier concentration of an InGaAlN mixed crystal is controlled in a lower range with high reproducibility, and a light emitting device obtained by using the III–V group compound semiconductor has high light emitting efficiency.

What is claimed is:

1. A III–V group compound semiconductor represented by the general formula In$_x$Ga$_y$Al$_z$N (x+y+z=1, $0 \leq x \leq 1$, $0 \leq y \leq 1$, $0 \leq z \leq 1$) in which the concentration of an n-type carrier is $1\times10^{19}$ cm$^{-3}$ or less and the concentration of a p-type dopant is $1\times10^{17}$ cm$^{-3}$ or more and $1\times10^{21}$ cm$^{-3}$ or less;

wherein the n-type carrier and the p-type dopant are contained in a single layer.

2. A III–V group compound semiconductor having a structure in which a layer (B) composed of a III–V group compound semiconductor represented by the general formula In$_u$Ga$_v$Al$_w$N (u+v+w=1, $0<u \leq 1$, $0 \leq v<1$, $0 \leq w<1$) is adjacent to a first layer (A) composed of a III–V group compound semiconductor represented by the general formula In$_x$Ga$_y$Al$_z$N (x+y+z=1, $0 \leq x \leq 1$, $0 \leq y \leq 1$, $0 \leq z \leq 1$) in which the concentration of an n-type carrier is $1\times10^{19}$ cm$^{-3}$ or less and the concentration of a p-type dopant is $1\times10^{17}$ $cm^{-3}$ or more and $1 \times 10^{21}$ $cm^{-3}$ or less, and the band gap is larger than that of said second layer (B);

wherein the n-type carrier and the p-type dopant are contained in a single layer.

3. A III–V group compound semiconductor having a structure in which a layer (A) composed of a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ $cm^{-3}$ or less and the concentration of a p-type dopant is $1 \times 10^{17}$ $cm^{-3}$ or more and $1 \times 10^{21}$ $cm^{-3}$ or less is adjacent to a layer (C) composed of a p-type III–V group compound semiconductor represented by the general formula $In_aGa_bAl_cN$ (a+b+c=1, $0 \leq a \leq 1$, $0 \leq b \leq 1$, $0 \leq c \leq 1$);

wherein the n-type carrier and the p-type dopant are contained in a single layer.

4. A III–V group compound semiconductor having a structure comprising at least one layer (A) composed of a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ $cm^{-3}$ or less and the concentration of a p-type dopant is $1 \times 10^{17}$ $cm^{-3}$ or more and $1 \times 10^{21}$ $cm^{-3}$ or less, between a layer (B) composed of a III–V group compound semiconductor represented by the general formula $In_uGa_vAl_wN$ (u+v+w=1, $0<x \leq 1$, $0 \leq y<1$, $0 \leq z<1$) and a layer (C) composed of a p-type III–V group compound semiconductor represented by the general formula $In_aGa_bAl_cN$ (a+b+c=1, $0 \leq a \leq 1$, $0 \leq b \leq 1$, $0 \leq c \leq 1$), wherein the n-type carrier and the p-type dopant are contained in a single layer, and wherein layer (A) is adjacent to layer (C).

5. A III–V group compound semiconductor having a structure comprising a layer (B) composed of a III–V group compound semiconductor represented by the general formula $In_uGa_vAl_wN$ (u+v+w=1, $0<u \leq 1$, $0 \leq v<1$, $0 \leq w<1$) carrying thereon a laminated layer (D) composed of an n-type III–V group compound semiconductor represented by the general formula $In_pGa_qAl_rN$ (p+q+r=1, $0 \leq p \leq 1$, $0 \leq q \leq 1$, $0 \leq r \leq 1$) having larger band gap than that of said layer (B), and at least one layer (A) composed of a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ $cm^{-3}$ or less and the concentration of a p-type dopant is $1 \times 10^{17}$ $cm^{-3}$ or more and $1 \times 10^{21}$ $cm^{-3}$ or less, between said layer (D) composed of the n-type III–V group compound semiconductor and a layer (C) composed of a p-type III–V group compound semiconductor represented by the general formula $In_aGa_bAl_cN$ (a+b+c=1, $0 \leq a \leq 1$, $0 \leq b \leq 1$, $0 \leq c \leq 1$), on the opposite side to said layer (B);

wherein the n-type carrier and the p-type dopant are contained in a single layer.

6. The III–V group compound semiconductor according to any one of claims 1 to 5 wherein the p-type dopant is Mg and/or Zn.

7. A method of producing a III–V group compound semiconductor according to any one of claims 1 to 5, comprising growing a III–V group compound semiconductor represented by the general formula $In_xGa_yAl_zN$ (x+y+z=1, $0 \leq x \leq 1$, $0 \leq y \leq 1$, $0 \leq z \leq 1$) in which the concentration of an n-type carrier is $1 \times 10^{19}$ $cm^{-3}$ or less and the concentration of a p-type dopant is $1 \times 10^{17}$ $cm^{-3}$ or more and $1 \times 10^{21}$ $cm^{-3}$ or less, at temperatures of 600° C. or more and 950° C. or less according to a metal organic vapor phase growth method.

8. A light emitting device obtained by using a III–V group compound semiconductor according to any one of claims 1 to 5.

* * * * *